United States Patent
Hotaka

(10) Patent No.: US 7,453,295 B2
(45) Date of Patent: Nov. 18, 2008

(54) LOW-VOLTAGE DETECTION RESET CIRCUIT

(75) Inventor: Kazuo Hotaka, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 36 days.

(21) Appl. No.: 11/812,510

(22) Filed: Jun. 19, 2007

(65) Prior Publication Data
US 2008/0012613 A1 Jan. 17, 2008

(30) Foreign Application Priority Data
Jun. 20, 2006 (JP) ............... 2006-169832

(51) Int. Cl.
*H03L 7/00* (2006.01)
(52) U.S. Cl. ............ 327/143; 327/142; 327/198; 327/77

(58) Field of Classification Search ............ 327/77, 327/87, 89, 142, 143, 198
See application file for complete search history.

(56) References Cited

U.S. PATENT DOCUMENTS
7,221,200 B1 * 5/2007 Kotra et al. ............ 327/143

* cited by examiner

*Primary Examiner*—Long Nguyen
*Assistant Examiner*—Brandon S Cole
(74) *Attorney, Agent, or Firm*—Morrison & Foerster LLP

(57) ABSTRACT

A low-voltage detection reset circuit that suppresses a current consumption in a stand-by mode and is reduced in a size is offered. The low-voltage detection reset circuit is provided with a power-on reset circuit that operates only at power-on and outputs a reset pulse and is configured to set a detection level of a detection level setting circuit at a default value using the reset pulse and to activate a programmable low-voltage detection circuit. After the programmable low-voltage detection circuit is activated, a detection level of the programmable low-voltage detection circuit can be modified from the default value by a register.

5 Claims, 3 Drawing Sheets

LOW-VOLTAGE DETECTION RESET CIRCUIT

CROSS-REFERENCE OF THE INVENTION

This application claims priority from Japanese Patent Application No. 2006-169832, the content of which is incorporated herein by reference in its entirety.

BACKGROUND OF THE INVENTION

1. Field of the Invention

This invention relates to a low-voltage detection reset circuit that detects reduction in a power supply voltage supplied to a semiconductor integrated circuit and resets a system of the semiconductor integrated circuit.

2. Description of the Related Art

When a programmable low-voltage detection circuit is incorporated into a microcomputer, a low-voltage detection circuit with a power-on reset function has been also incorporated in the microcomputer in order to make sure that a reset pulse is generated at power-on (turning-on of a power supply). The programmable low-voltage detection circuit is a low-voltage detection circuit capable of programming a detection level corresponding to a power supply voltage. The low-voltage detection circuit with the power-on reset function is a low-voltage detection circuit provided with a function to generate the reset pulse at the power-on. While the programmable low-voltage detection circuit is inactivated during a non-use period, the low-voltage detection circuit with the power-on reset function is in operation all the time.

FIG. 4 is a circuit diagram of such a low-voltage detection reset circuit. A programmable low-voltage detection circuit 10 is provided with a first comparator circuit 1, a PMOS (P-channel type MOS transistor) 12 that controls supply of a power supply voltage Vdd to the first comparator circuit 11 and a first detection level setting circuit 13 capable of setting a first detection level that is variable corresponding to the power supply voltage Vdd. A reference voltage Vref (1.0 V-1.5 V) that is independent of the power supply voltage Vdd is applied from a reference voltage generating circuit 14 to a positive terminal (+) of the first comparator circuit 11. A first detection level is applied from the first detection level setting circuit 13 to a negative terminal (−) of the first comparator circuit 11. The reference voltage generating circuit 14 can be made of a so-called band gap type reference voltage generating circuit.

The first detection level from the first detection level setting circuit 13 can be set at any of $2^n$ levels corresponding to n bits of control signals from a register 15. Control data is set to the register 15 through bus lines 16 of a microcomputer. To describe concretely, the first detection level setting circuit 13 can be composed of ladder resistors that divide the power supply voltage Vdd and a group of switches that selects an output voltage divided by the ladder resistors corresponding to the control signals. If the first detection level is set to be the reference voltage Vref when the power supply voltage Vdd is 2.5 V for example, the first detection level becomes equal to or lower than the reference voltage Vref and the first comparator circuit 11 outputs a reset pulse of a high level when the power supply voltage Vdd drops to 2.5 V or below.

A low-voltage detection circuit with a power-on reset function 20 is provided with a second comparator circuit 21 and a second detection level setting circuit 22 that sets a second detection level corresponding to the power supply voltage Vdd. The reference voltage Vref is applied from the reference voltage generating circuit 14 to a positive terminal (+) of the second comparator circuit 21. The second detection level is applied from the second detection level setting circuit 22 to a negative terminal (−) of the second comparator circuit 21.

The second detection level from the second detection setting circuit 22 is set to be lower than the first detection level from the first detection setting circuit 13, and is set to become the reference voltage Vref when the power supply voltage Vdd is 1.8 V, for example. When the power supply voltage Vdd drops to 1.8 V or below, the second detection level becomes equal to or lower than the reference voltage Vref, and the second comparator circuit 21 outputs a reset pulse of the high level. The second comparator circuit 21 in the low-voltage detection circuit with the power-on reset function 20 is in operation all the time and an electric current $I_0$ flows through it all the time.

The reset pulse outputted from the programmable low-voltage detection circuit 10 and the reset pulse outputted form the low-voltage detection circuit with the power-on reset function 20 are inputted to an OR circuit 23 that outputs a system reset signal SRES used to reset the microcomputer.

Operations of the low-voltage detection reset circuit structured as described above will be explained. The reset pulse of the high level is outputted from the low-voltage detection circuit with the power-on reset function 20 at the power-on. The reset pulse is turned to a low level to lift the reset when the power supply voltage Vdd becomes 1.8 V or above. After that, the PMOS 12 is turned on in response to the control signals from the register 15 of the programmable low-voltage detection circuit 10 to activate the programmable low-voltage detection circuit 10 to detect the reduction in the power supply voltage Vdd at a programmed detection level. Therefore, the power-on reset function and a programmable low-voltage detection function can be acquired with this low-voltage detection reset circuit.

However, since the low-voltage detection reset circuit described above includes the low-voltage detection circuit with the power-on reset function 20, it has problems that the electric current $I_0$ flows in a stand-by mode and a size of the circuit is large.

SUMMARY OF THE INVENTION

This invention is directed to solve the problems addressed above, and offers a low-voltage detection reset circuit including a power-on reset circuit that outputs a first reset pulse in response to a rise of a power supply voltage, a detection level setting circuit capable of variably setting a detection level corresponding to the power supply voltage, a low-voltage detection circuit that compares the detection level with a reference voltage that is independent of the power supply voltage and outputs a second reset pulse when the detection level is equal to or lower than the reference level and a control circuit that controls the detection level setting circuit so that the detection level is set to a default value in response to the first reset pulse.

DETAILED DESCRIPTION OF THE INVENTION

Figure 1:
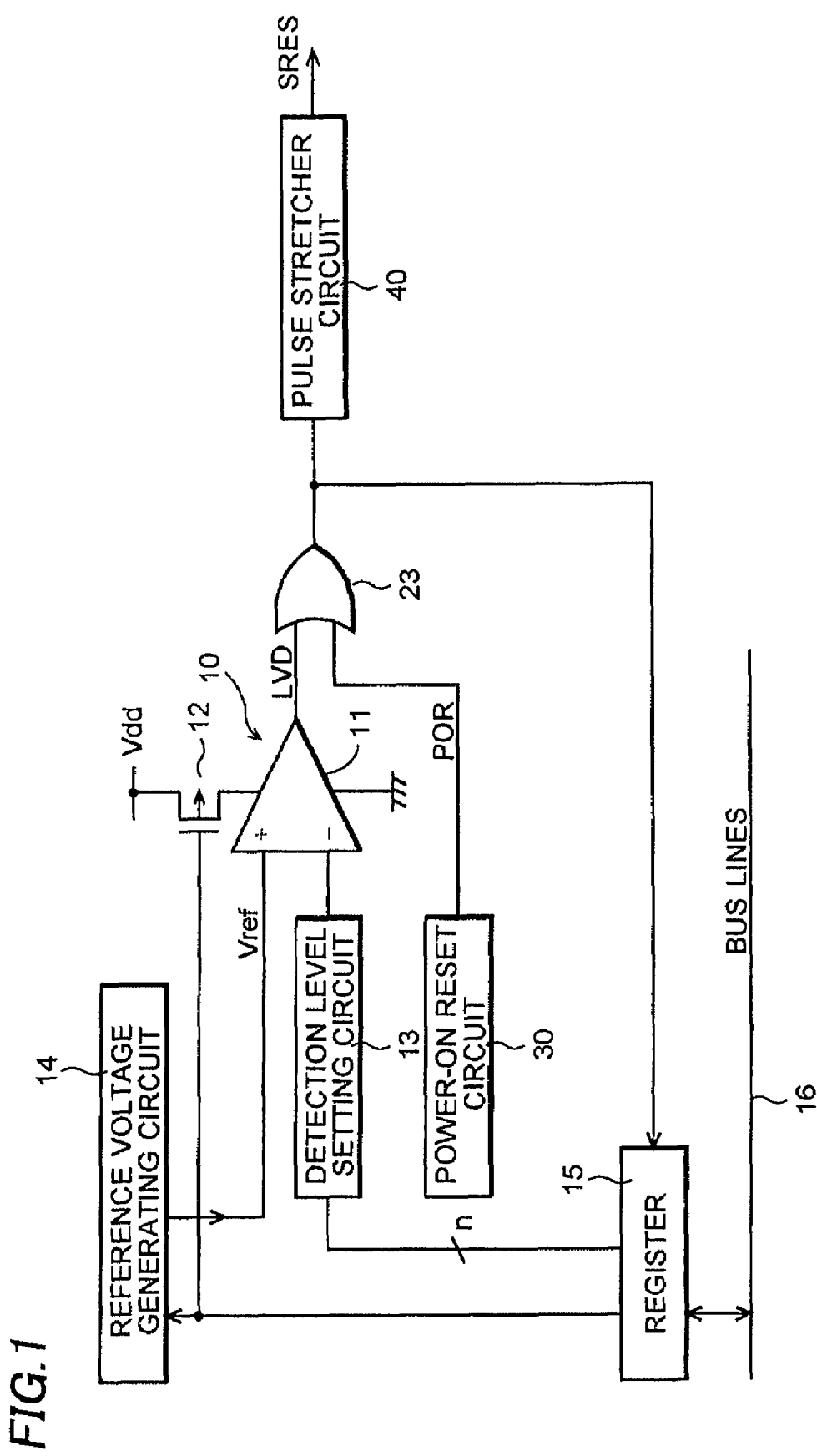
FIG. 1 is a circuit diagram of a low-voltage detection reset circuit according to an embodiment of this invention.
Figure 4:
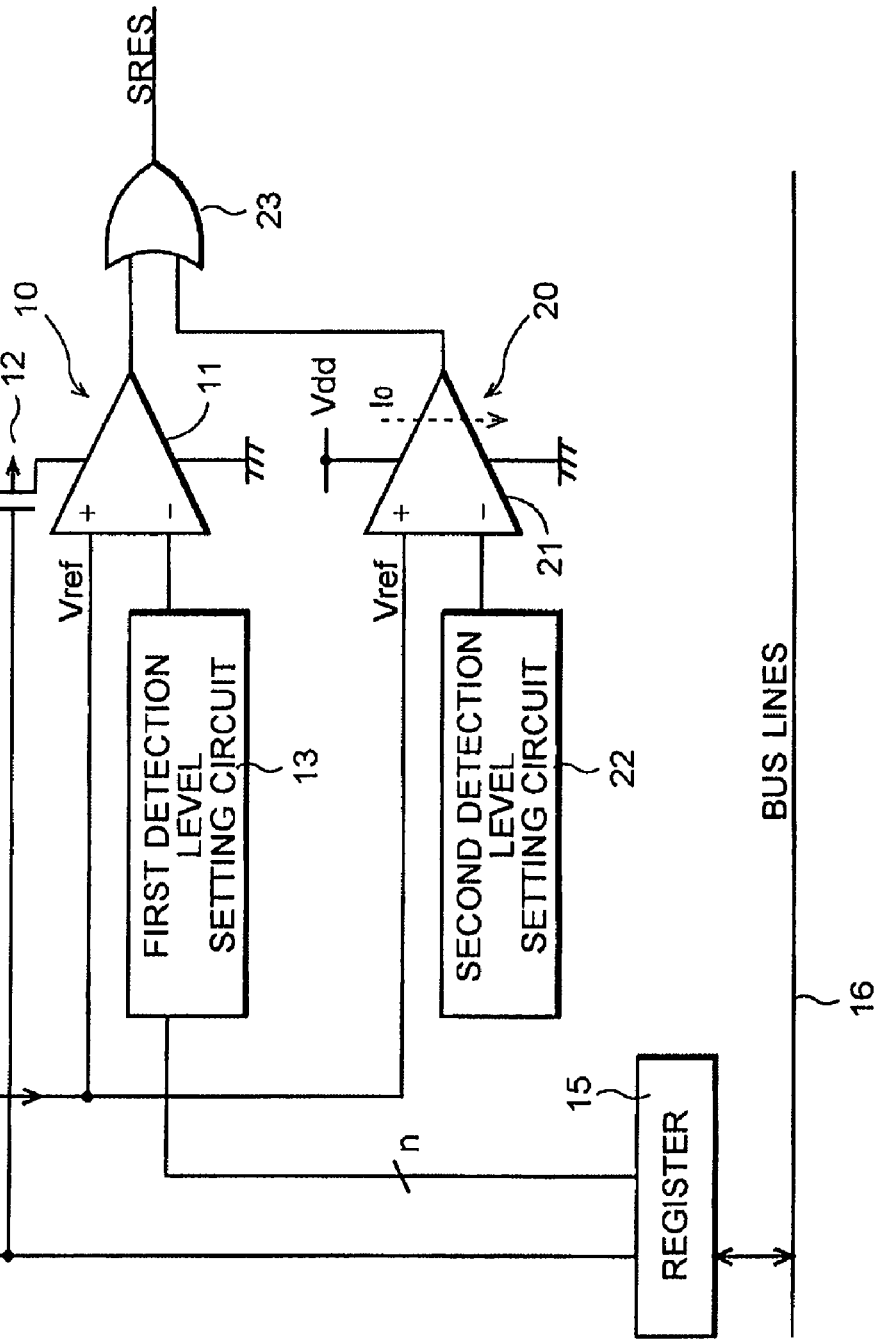
FIG. 4 is a circuit diagram of a conventional low-voltage detection reset circuit.

A low-voltage detection reset circuit according to an embodiment of this invention is described referring to the drawings. FIG. 1 is a circuit diagram of the low-voltage detection reset circuit. The same components in FIG. 1 as in FIG. 4 are denoted by the same symbols. The low-voltage detection reset circuit according to the embodiment of this invention is provided with a power-on reset circuit 30 that operates only at power-on and outputs a reset pulse of a high level and is configured to set a detection level of a detection level setting circuit 13 at a default value using the reset pulse and to activate a programmable low-voltage detection circuit 10. An output of the power-on reset circuit 30, as well as an output of the programmable low-voltage detection circuit 10, is inputted to an OR circuit 23, from which a system reset signal SRES is obtained. After the programmable low-voltage detection circuit 10 is activated, the detection level of the programmable low-voltage detection circuit 10 can be modified from the default value to another value (preferably a value larger than the default value) by a register 15.

With this, the power-on reset function and the programmable low-voltage detection function are acquired as with the conventional circuit. In addition, power consumption in the stand-by mode is suppressed since the power-on reset circuit 30 operates only at the power-on and the electric current does not flow all the time unlike the conventional low-voltage detection circuit with the power-on reset function 20. Also the size of the circuit can be made small compared with the conventional circuit because a size of the power-on reset circuit 30 is relatively small.

Figure 2:
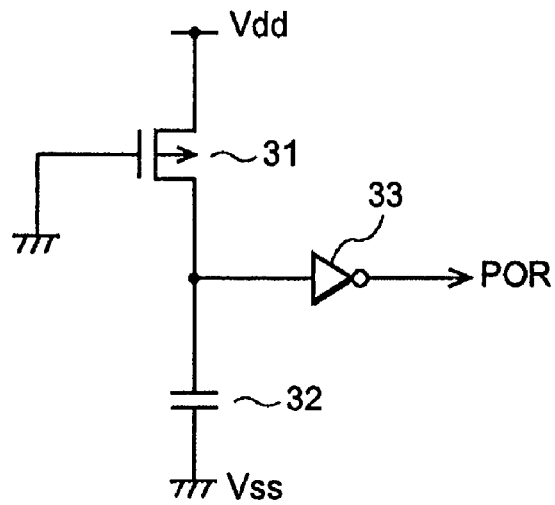
FIG. 2 is a circuit diagram of a power-on reset circuit.

FIG. 2 shows an example of the power-on reset circuit 30, which is composed of a PMOS 31 and a capacitor 32 connected in series between a power supply voltage Vdd and a ground voltage Vss and an inverter 33. The power supply voltage Vdd is applied to a source of the PMOS 31, the ground voltage Vss is applied to its gate, and its drain is connected with a terminal of the capacitor 32. The ground voltage Vss is applied to another terminal of the capacitor 32. A voltage at a connecting node between the PMOS 31 and the capacitor 32 is inputted to the inverter 33 (CMOS inverter, for example), and a reset pulse POR is obtained from the inverter 33. Since the PMOS 31 is used as a resistor element, an NMOS or other resistor element may be used instead of the PMOS 31.

Figure 3:
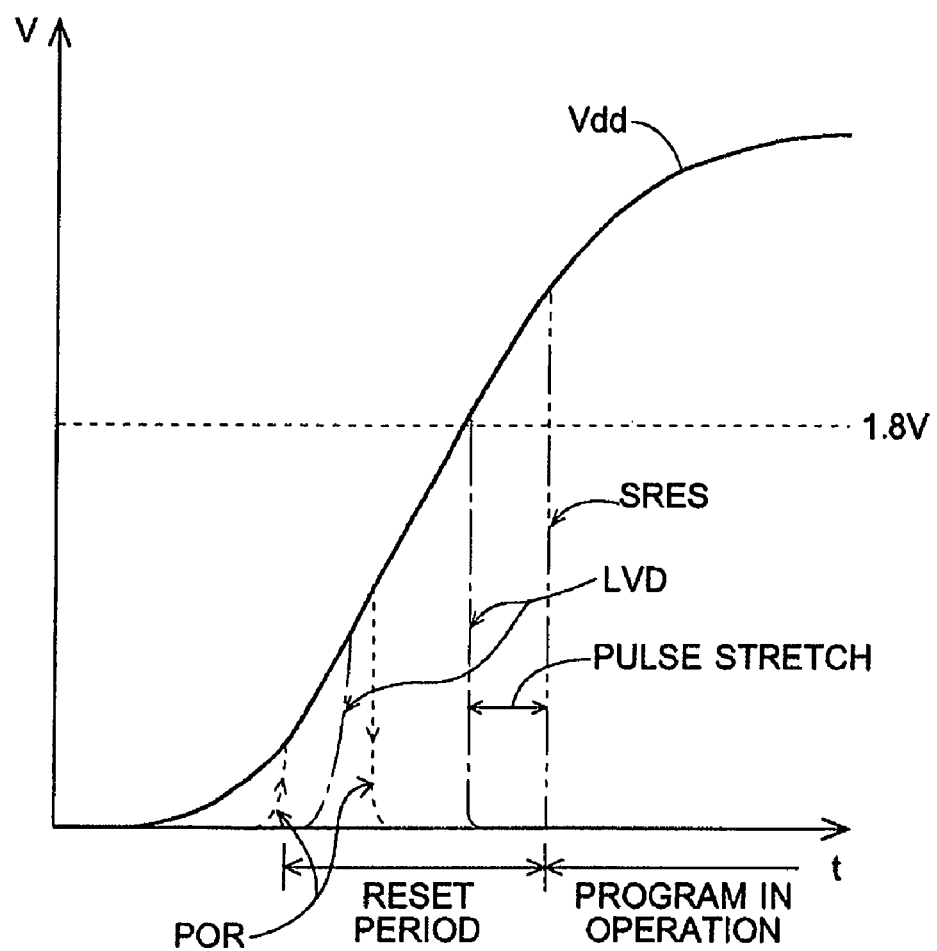
FIG. 3 is an operational waveform chart of the low-voltage detection reset circuit according to the embodiment of this invention.

Operations of the low-voltage detection reset circuit according to the embodiment of this invention will be explained referring to a waveform chart shown in FIG. 3. First, the power-on reset circuit 30 operates at the power-on and the reset pulse POR of the high level is generated. The reset pulse POR is inputted to the register 15 through the OR circuit 23. The PMOS 12 is turned on by a control signal from the register 15 and the detection level of the detection level setting circuit 13 is set to the default value (a level corresponding to Vdd=1.8 V, for example). With this, the programmable low-voltage detection circuit 10 is activated at the default value.

Then the programmable low-voltage detection circuit 10 generates a reset pulse LVD of the high level to keep the reset state. After that, when the power supply voltage Vdd becomes 1.8 V, the reset pulse LVD turns to the low level to lift the reset, and a program stored in a ROM in the microcomputer is put into operation. In order to secure a long enough reset period at that time, there may be provided a pulse stretcher circuit 40 that stretches a width of the reset pulse of the programmable low-voltage detection circuit 10. The pulse stretcher circuit 40 can be composed of a counter with a reset terminal to which an output of the programmable low-voltage detection circuit 10 is inputted.

After that, the detection level of the programmable low-voltage detection circuit 10 is set to a desired value (a level corresponding to Vdd=2.5 V, for example) by the register 15 according to the program of the microcomputer. When the programmable low-voltage detection circuit 10 is not used, the PMOS 12 is turned off to make it inactive. When the power supply voltage Vdd becomes 2.5 V or below while the programmable low-voltage detection circuit 10 is activated, the programmable low-voltage detection circuit 10 generates the reset pulse and thereafter the detection level is reset to the default value.

With the low-voltage detection reset circuit according to the embodiment of this invention, there are obtained effects that a current consumption in the stand-by mode is suppressed and the size of the circuit is reduced, in addition to that the power-on reset function and the programmable low-voltage detection function are acquired.

What is claimed is:

1. A low-voltage detection reset circuit comprising:
    a power-on reset circuit that outputs a first reset pulse in response to a rise of a power supply voltage;
    a detection level setting circuit that is capable of variably setting a detection level corresponding to the power supply voltage;
    a low-voltage detection circuit that compares the detection level with a reference voltage that is independent of the power supply voltage and outputs a second reset pulse when the detection level is equal to or lower than the reference level; and
    a control circuit that controls the detection level setting circuit so that the detection level is set to a default value in response to the first reset pulse.

2. The low-voltage detection reset circuit of claim 1, further comprising a switch to control a supply of the power supply voltage to the low-voltage detection circuit in response to a control signal from the control circuit.

3. The low-voltage detection reset circuit of claim 1, further comprising a pulse stretcher circuit that stretches a width of the second reset pulse.

4. The low-voltage detection reset circuit of claim 1, further comprising a resistor element and a capacitor connected in series between the power supply voltage and a ground voltage and an inverter to which a voltage at a connecting node between the resistor element and the capacitor is inputted.

5. The low-voltage detection reset circuit of claim 4, wherein the control circuit controls the detection level setting circuit so that the detection level is modified from the default value to a value different from the default value.

* * * * *